(12) United States Patent
Ishikawa et al.

(10) Patent No.: US 6,483,111 B1
(45) Date of Patent: Nov. 19, 2002

(54) THERMAL INFRARED-DETECTOR ARRAY AND METHOD OF FABRICATION THEREOF

(75) Inventors: Tomohiro Ishikawa, Tokyo (JP); Masafumi Kimata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/394,095

(22) Filed: Sep. 13, 1999

(30) Foreign Application Priority Data

Sep. 14, 1998 (JP) .......................................... 10-259958

(51) Int. Cl.[7] .................................................. G01J 5/20
(52) U.S. Cl. .................................. 250/338.4; 250/338.1
(58) Field of Search .......................... 250/338.4, 338.1, 250/332

(56) References Cited

U.S. PATENT DOCUMENTS

| 4,948,963 A | * | 8/1990 | Ballingall | 250/338.1 |
| 5,100,479 A | * | 3/1992 | Wise et al. | 136/225 |
| 5,343,064 A | * | 8/1994 | Spangler et al. | 257/350 |
| 5,489,792 A | | 2/1996 | Hu et al. | 257/347 |
| 5,698,852 A | * | 12/1997 | Tanaka et al. | 250/332 |

FOREIGN PATENT DOCUMENTS

| JP | 8186283 | 7/1996 |
| JP | 9166497 | 6/1997 |

OTHER PUBLICATIONS

Chan et al., "SOI/Bulk Hybrid Technology On SIMOX Wafers For High Performance Circuits With Good ESD Immunity", IEEE Electron Device Letters, vol. 16, No. 1, Jan. 1995, pp. 11–13.

* cited by examiner

Primary Examiner—Constantine Hannaher
Assistant Examiner—Otilia Gabor
(74) Attorney, Agent, or Firm—Leydig, Voit & Mayer, Ltd.

(57) ABSTRACT

A thermal infrared-detector array has semiconductor-junction elements as detectors. It has high sensitivity and low noise and is fabricated in semiconductor-fabrication process. The semiconductor-junction elements are located in a monocrystalline silicon layer overlying a silicon-oxide layer on a monocrystalline silicon substrate. A signal-output circuit reading out signals from the detector elements includes transistors located on the monocrystalline silicon substrate.

9 Claims, 6 Drawing Sheets

THERMAL INFRARED-DETECTOR ARRAY AND METHOD OF FABRICATION THEREOF

BACKGROUND OF THE INVENTION

The present invention relates generally to an infrared-detector array including a plurality of infrared detectors arranged in a matrix pattern. More specifically, this invention relates to a thermal infrared-detector array which detects infrared radiation from objects based on change in temperature-dependent characteristic of the detector caused by the infrared radiation absorption.

An infrared-detector array can not only take pictures of an object invisible to human eyes, but also measure a temperature of a distant object on a non-contact basis. The infrared-detector array is used for a variety of industrial and/or medical purposes such as, for example, measuring and controlling a fabrication line, diagnosing a human body, or detecting a human.

The infrared-detector array comprises a plurality of infrared detectors arranged in a matrix pattern and a signal output circuit disposed in the vicinity thereof for extracting a signal from the detector array.

The infrared detector is broadly available in two types depending on the basic mechanism of operation: One is a "quantum-type" capable of measuring an infrared radiation as photons, and the other is a "thermal type" capable of measuring the infrared radiation as an change in temperature change caused by the absorption of the infrared radiation. Although the "quantum type" detector is highly sensitive and has a short response time, it has a complicated structure and is highly expensive because it must be refrigerated to about −200° C. On the other hand, the "thermal" detector is simple in structure and can operate at ambient temperature even though the response time is relatively slow and, thus, it is widely used for general purposes.

The infrared-detector array comprising a plurality of bolometer-type detectors, which are disclosed in, for example, U.S. Pat. No. 5,260,255, is commercially available. The bolometer-type detector measures the infrared radiation in terms of change in resistance caused by the absorption of infrared radiation from an object.

Figure 7:
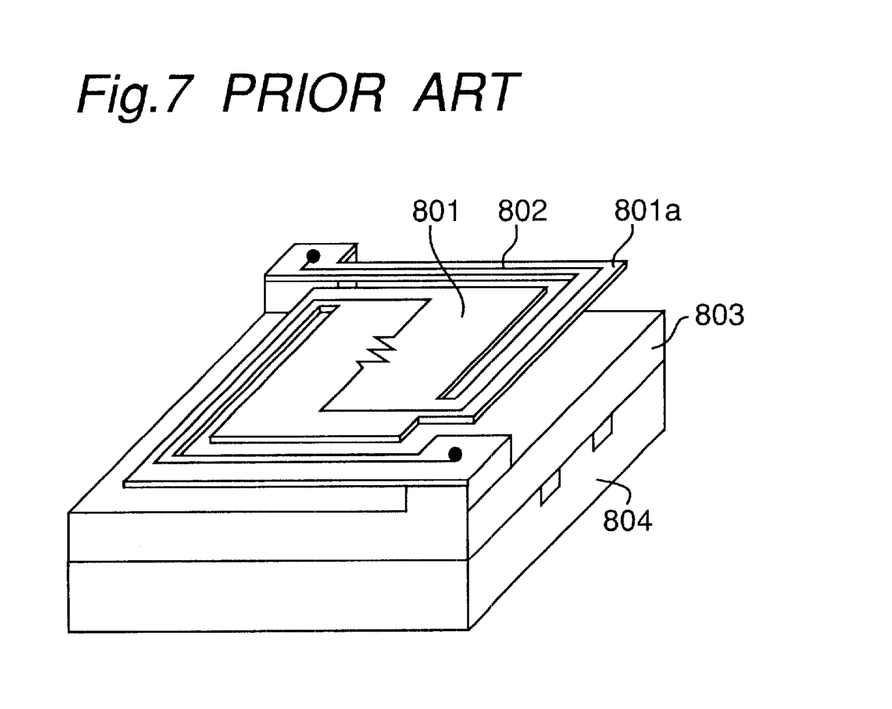
FIG. 7 shows a perspective view of the prior art bolometer-type infrared detector.

FIG. 7 shows a perspective illustration of the bolometer-type infrared detector comprising a support substrate 804, an insulating layer 803, leads 802 and resistance strips 801 supported above the insulating layer 803 by means of a plurality of, for example, diagonally opposite legs 801a that are formed by the use of a micromachining technique. When each of the resistance strips 801 are heated by infrared radiation, the resistance of the resistance strip 801 undergoes a change, and the change in resistance of the resistance strip 801 can be observed in terms of change in bias current or voltage applied to the resistance strip 801 through the leads 802 The resistance strip 801 is in the form of a thin film made of, for example, metal, ceramics such as vanadium oxide, or a polycrystal silicon. However, these materials for the resistance strip tend to bring about some problems associated with mass-productivity and performance.

By way of example, where the metallic thin film is used as a resistance strip for the detector, the rate of temperature dependent change of the resistance which is hereinafter referred to as a "Temperature Coefficient of Resistance, (or TCR for short)" is so low, for example, about 0.5%/K, that the sensitivity of the detector as a whole to the infrared radiation is short of the required sensitivity. Vanadium oxide has a relatively high TCR value, about 2.0%/K. However, the vanadium oxide is not used in the semiconductor-fabrication process because it may contaminate other semiconductor elements. Therefore, the infrared-detector array using vanadium oxide as a material for the resistance strip cannot be fabricated together with the signal output circuit and poses a problem that the detectors must be formed in a process separate from a process of making the signal output circuit. If the resistance material is employed in the form of a polycrystal silicon, the infrared detector can be integrated with the signal-output circuits. However, the S/N ratio of the infrared detector using the polycrystal silicon as a material for the resistance strip is poor because the doped impurity concentration in polycrystal silicon must be decreased to keep the TCR so high as to render the detector to be highly sensitive. If the doped impurity concentration is low, conduction by a trap level formed between grains in polycrystal silicon becomes dominant and, thus, the S/N ratio of the infrared detector becomes poor.

The thermal infrared detector utilizing a semiconductor-junction element has been suggested in, for example, the Japanese Laid-open Patent Publications No. 9-166497 and No. 8-186283. The semiconductor-junction element is, for example, a p-n junction formed on monocrystalline silicon; Schottky barrier diode; or other kind of transistor.

The infrared detector using the semiconductor-junction element detects the infrared radiation by utilizing a current-voltage characteristic change caused by change in temperature. In general, the semiconductor layers in the semiconductor-junction element has a high impurity concentration and a high crystallinity. Accordingly, the infrared detector using the semiconductor-junction element has a low resistance noise and a high S/N ratio.

However, with semiconductor-junction element formed directly on a monocrystalline silicon substrate, no efficient temperature increase by infrared absorption occurs in the semiconductor junction element, with the detector as a whole failing to provide a sufficient sensitivity because of a high thermal conductivity of the silicon substrate. The Japanese Laid Open Patent Publication No. 8-186283 describes that an SOI structure may be applied to the infrared detector to improve the thermal sensitivity. In the SOI structure, the semiconductor-junction elements are isolated from the silicon substrate by a silicon oxide having a low thermal conductivity.

The infrared detector using semiconductor-junction elements has advantages in that it can be fabricated in a semiconductor-fabrication process and in that it has a high sensitivity and a low noise. However, no infrared-detector array has been made available, wherein the semiconductor-junction elements are arranged in a matrix pattern and are integrated with the signal-output circuit.

SUMMARY OF THE INVENTION

An objective of the present invention is to provide an infrared-detector array including semiconductor-junction elements as infrared detectors and a method of fabrication thereof.

In accomplishing the above and other objectives, one aspect of the present invention provides an infrared-detector array which comprises a plurality of thermal-type infrared detectors arranged in linear or matrix, and a signal-output circuit reading out signals from the infrared detectors;

wherein the infrared detectors include semiconductor-junction elements formed in a monocrystalline-silicon layer overlying a silicon-oxide layer on a monocrystalline-silicon substrate, and wherein the signal-output circuit includes transistors formed on the monocrystalline-silicon substrate.

The invention increases the breakdown voltage of the transistors in the signal-output circuit, and driving voltage of the detectors. Thus the sensitivity of the infrared-detector array is increased.

Preferably, the monocrystalline-silicon substrate is partly removed to form cavities under the semiconductor-junction elements, so that the semiconductor-junction elements are thermally insulated.

The semiconductor-junction elements are preferably diodes, bipolar transistors, junction field-effect transistors, or MOS transistors.

In another aspect of the present invention, a process of producing the infrared-detector array comprises the steps of:

(A) preparing a substrate wherein a monocrystalline-silicon layer is overlying a silicon-oxide layer on a monocrystalline-silicon substrate;

(B) removing the monocrystalline-silicon layer in a transistor-on-substrate region where transistors of the signal-output circuit are formed directly on the monocrystalline-silicon substrate;

(C) removing the silicon-oxide layer in the transistor-on-substrate region;

(D) forming the semiconductor-junction elements in the monocrystalline-silicon layer, and at least a part of transistors of the signal-output circuit directly on the monocrystalline-silicon substrate.

In step (B), it is preferable to etch the monocrystalline-silicon layer to form islands in a region where the semiconductor-junction elements are formed in the monocrystalline-silicon layer.

In still another aspect of the invention, a process of producing an infrared-detector array comprises the steps of:

(A) preparing a substrate wherein a monocrystalline-silicon layer is overlying a silicon-oxide layer on a monocrystalline-silicon substrate;

(B) oxidizing by LOCOS (Local Oxidation of Silicon) method the monocrystalline-silicon layer all-over a transistor-on-substrate region where transistors of the signal-output circuit are formed directly on the monocrystalline-silicon substrate; and partly, leaving appropriate spaces, in a element-forming region where the semiconductor-junction elements are formed in the monocrystalline-silicon layer;

(C) removing the oxidized monocrystalline-silicon layer and the silicon-oxide layer in the transistor-on-silicon region;

(D) forming the semiconductor-junction elements in the monocrystalline-silicon layer, and at least a part of transistors of the signal-output circuit directly on the monocrystalline-silicon substrate.

According to this process of the present invention, a step at the end of the monocrystalline-silicon layer becomes smooth. As a result, fabrication problems, such as etching residue and lead disconnection, are suppressed.

BRIEF DESCRIPTION OF THE DRAWINGS

The above and other objectives and features of the present invention will become more apparent from the following description of- a preferred embodiment thereof with reference to the accompanying drawings, throughout which like parts are designated by like reference numerals, and wherein.

DETAILED DESCRIPTION OF THE PREFERRED EMBODIMENT

This application is based on an application No. 10-259958 filed Sep. 19, 1998 in Japan, the contents of which are incorporated herein by reference.

Figure 1A:
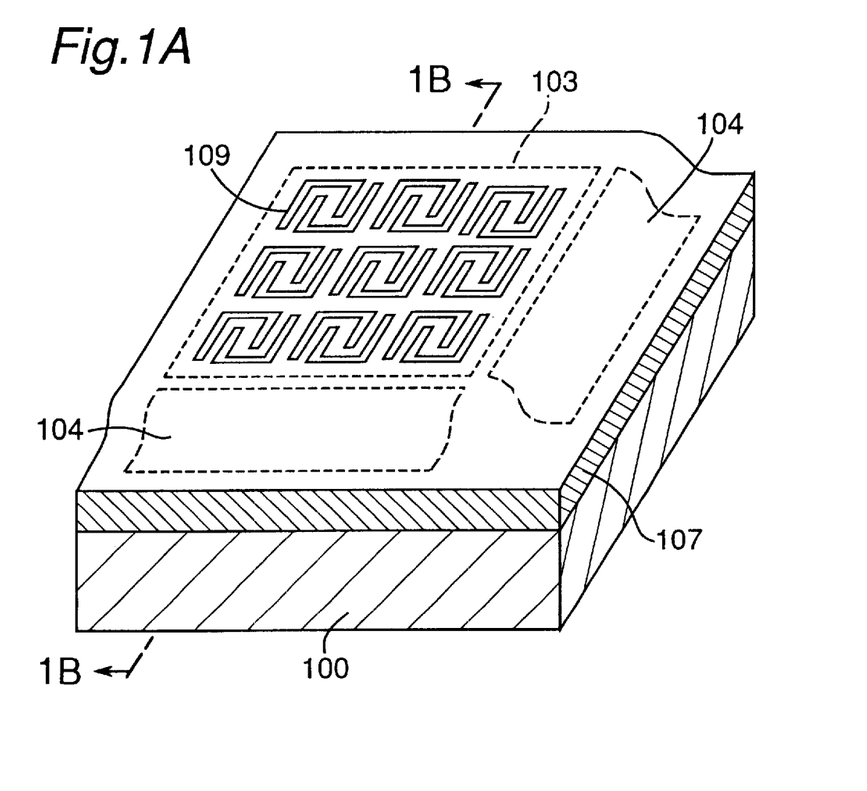
FIG. 1A shows a perspective view of an infrared-detector array of the present invention.
Figure 1B:
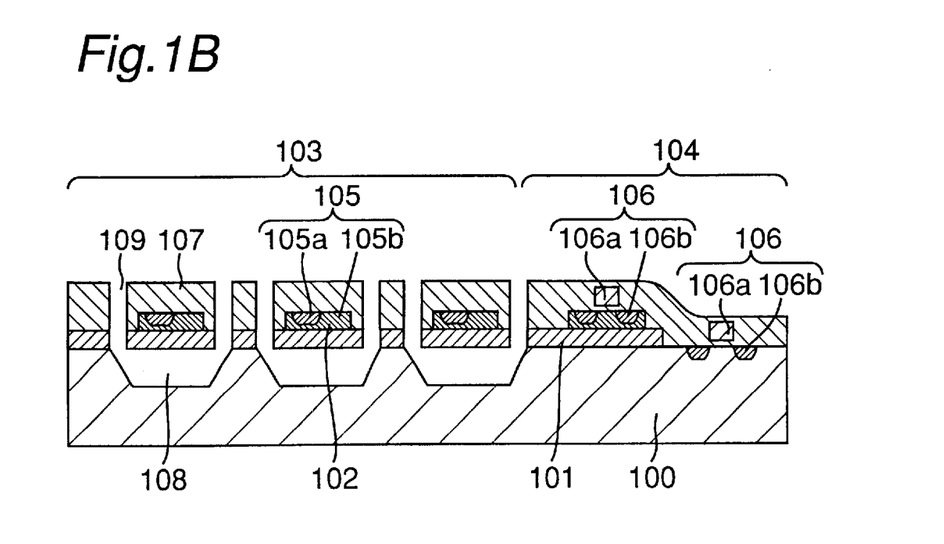
FIG. 1B shows a cross-sectional view taken along lines 1B—1B in FIG. 1A.

Referring to FIGS. 1A and 1B, a thermal-type infrared-detector array embodying the present invention comprises a plurality of thermal-type infrared detectors 103, arranged in a matrix pattern of, for example, three lines by three rows, and a signal-output circuit 104.

Each of the infrared detector 103 comprises a semiconductor-junction element 105, formed on a monocrystalline silicon layer 102 that is formed on a monocrystalline silicon substrate 100 through a silicon-oxide layer 101. Alternatively, the thermal infrared detectors 103 forming the detector array of the present invention may be arranged in a linear row. Each semiconductor-junction element 105 is, for example, a p-n junction diode including a p-type layer 105a and an n-type layer 105b.

The signal-output circuit 104 comprises a plurality of transistors 106, some of which are formed directly on the monocrystalline silicon substrate 100. Each of the transistors 106 includes gate electrode 106a and source (or drain) electrode 106b.

The infrared-detector array is covered with a protective overcoat 107 with cavities 108 defined beneath the p-n junction diodes 105 to thermally insulate them. The cavities 108 can be formed by the use of any known etching process by introducing an etchant through etching holes 109. Leads, isolation layers, capacitors, resistors are not shown for the sake of brevity since they do not constitute the subject matter of the present invention.

With the detector array of the structure described above, infrared light impinging on the infrared-detector array from above as viewed in FIG. 1A is absorbed by and heats the p-n junction diodes 105, accompanied by change in current-voltage characteristic of the diodes 105. Since forward bias voltage is applied to the p-n junction diodes 105 to flow a predetermined constant current therethrough, the change in current-voltage characteristic of the diodes 105 causes this bias voltage to change. This change of the bias voltage is detected through the signal-output circuit 104 which eventually provides an indication of the amount of the infrared radiation detected by the detector array. Thus, the amount of the infrared radiation impinging on each of the p-n junction diodes 105 is measured.

Although each semiconductor-junction element 105 has been described as composed of the single p-n junction diode, it is preferable that a plurality of p-n junction diodes are connected in series where the sensitivity to the temperature change is desired to be high, that is, the rate of temperature-dependent change of the bias voltage applied to the p-n junction diodes to allow the latter to pass the constant current therethrough is desired to be large. Although the rate of the temperature-dependent change of the bias voltage in the single p-n junction diode is about 1.4 mV/K, it would be multiplied by a factor of n, wherein n is an integer greater than 1, if n p-n junction diodes are connected in series. However, in that case, the bias voltage itself must also be increased to a value n times higher than that required by the use of the single p-n junction diode. Accordingly, from the practical point of view, the preferred number of the p-n junctions to be connected in series is about ten.

Instead of the p-n junction diodes 105, any element, for example, Schottky junction diode, bipolar transistors, junction field-effect transistors or MOS transistors, of a kind having an electric characteristic which changes with change in temperature may be used. Where the Schottky junction diodes are employed in place of the p-n junction diodes 105, they can be used as a detector in the same manner as the p-n junction diodes.

In the case of the bipolar transistors, change in current flowing through the active region has to be detected as an output signal. In the case of the junction field-effect transistors or MOS transistors, change in current flowing through the saturated region has to be used as an output signal. Transistors occupy a larger area than the diodes and, hence, the effective surface area of each element that absorbs the incident infrared radiation decreases. However, the transistors have an advantage in that the voltage to achieve sufficient sensitivity is generally smaller than diodes.

Figure 4:
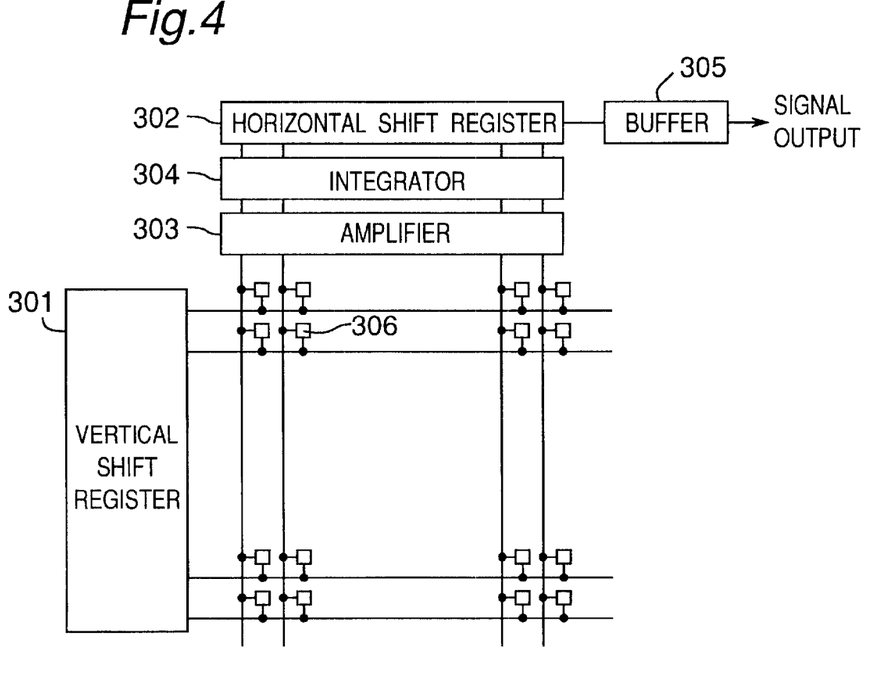
FIG. 4 shows a block diagram of a signal output circuit employed in the detector array of the present invention.

FIG. 4 shows a block diagram of the signal-output circuit 104. The signal-output circuit 104 comprises a vertical shift register 301, a horizontal shift register 302, an amplifier 303, an integrator 304 and a buffer 305.

P-n junction diodes 306 are arranged in a matrix pattern and connected to leads extending respectively from the vertical and horizontal shift registers 301 and 302.

First, the vertical shift register 301 selects one line of the matrix. Forward bias voltage is applied to the p-n junction diodes 306 in the line selected by the vertical shift-register 301, through analog switches in the vertical shift register 301. During one line of the matrix being selected, each column of the matrix is sequentially selected by the horizontal shift register 302. Thus, signals generated at the p-n junction diodes 306 in the selected line are sequentially read out. Signals so read out are outputted to an external circuit through the amplifier 303, then the integrator 304 and finally the buffer 305. The amplifier 303 amplifies the signals. The integrator 304 suppresses noises in the signals by limiting the band width. The buffer 305 improves a driving capability by lowering impedance.

In this embodiment, in order to improve the thermal sensitivity of the p-n junction diodes 105, a monocrystalline silicon layer 102 is isolated from a monocrystalline silicon substrate 100 by means of a silicon oxide layer 101 having a relatively small thermal conductivity. This structure is a so-called "SOI" structure. Further, in order to improve thermal insulating ability, a cavity 108 is formed beneath each of the p-n junction diodes 105, and The p-n junction diodes 105 are supported above the respective cavities 108 by means of the silicon-oxide layer 101.

For the substrate employed in the infrared detector array of the present invention, a "SIMOX(Separation by Implanted Oxygen)" substrate or a "BESOI(Bonded and Etchbacked SOI)" substrate may be used. The "SIMOX" substrate can be fabricated by implanting oxygen ions into a monocrystalline silicon substrate. On the other hand, the "BESOI" substrate can be fabricated by bonding a monocrystalline silicon substrate to another monocrystalline silicon substrate having an oxidized surface.

Hereinafter, characteristics of transistors each formed on the monocrystalline silicon layer in the SOI substrate will now be discussed. The monocrystalline silicon layer in the SOI substrate generally has a film thickness of 1000–2000 Å, and is electrically insulated from the substrate through the silicon-oxide layer. For this reason, the transistors have a relatively low parasitic capacitance such that the transistors can operate with a relatively small power consumption and at a high speed. However, those transistors tend to pose the following problems:

(1) The transistors formed in the monocrystalline-silicon layer of the SOI substrate have a low breakdown voltage between the source and the drain.

The source-drain breakdown voltage is low because of the parasitic bipolar transistor effect, making the transistors difficult to operate with the source-drain voltage of 5 or higher volts.

(2) A current in the saturated region of the transistors formed in the monocrystalline silicon layer is unstable.

Figure 6:
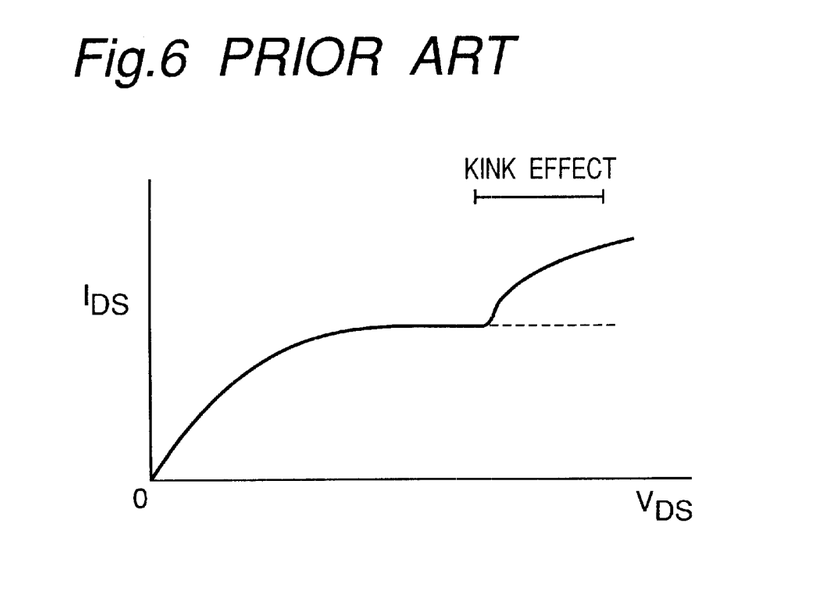
FIG. 6 is a graph showing an $I_{DS}$–$V_{DS}$ curve of a transistor on a SOI substrate.

Due to the floating body effect, the current-voltage curve of the transistor tends to give rise to a kinking as shown in FIG. 6 which illustrates a graph showing the relationship between the drain-source current $I_{DS}$ and the drain-source voltage $V_{DS}$ of the transistor. In the saturated region, a constant current flows inherently. However, once the kinking occurs, the source-drain current will change with change of the source-drain voltage.

The signal-output circuit 104 comprises, inter alia, a plurality of transistors. Where the standard semiconductor-fabrication process is applied to the SOI substrate, the transistors 106 forming parts of the signal-output circuit 104 are formed in the monocrystalline-silicon layer 104 in the SOI substrate. However, formation of the transistors 106 in the monocrystalline silicon layer 102 brings about many problems by reason of peculiarities of the SOI structure:

(1) Insufficient bias voltage in the infrared detector because of the low breakdown voltage of transistors in the signal-output circuit.

The bias voltage to be applied to the p-n junction diodes 306 is supplied through analog switches in the vertical shift register 301. The analog switches are each composed of a transistor. In the case where these transistors are formed in the monocrystalline silicon layer in the SOI substrate, the bias voltage is limited to about 5 V, breakdown voltage of transistors. On the other hand, to increase sensitivity of the detector, it is preferable to connect a plurality of p-n junctions in series, each of which requires a bias voltage of about 0.7 volt to be applied thereto. However, the number of the p-n junctions that can be connected in series with each other is limited to seven in view of the limited breakdown voltage of the transistors, and, therefore, the use of even the seven series-connected p-n junctions is incapable of providing a required high sensitivity.

(2) Signal distortion caused by the "kinking" effect.

Figure 5:
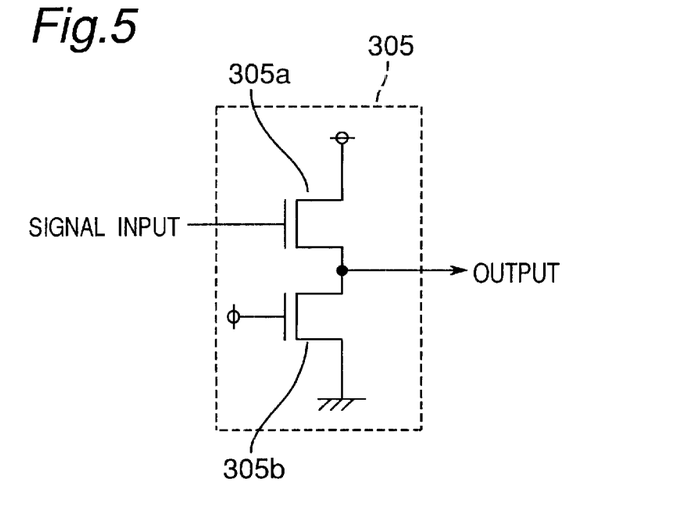
FIG. 5 shows a circuit diagram of a buffer in the signal output circuit.

The output signal from the detector array is outputted to the external circuit through the amplifier 303, the integrator 304 and the buffer 305 forming parts of the signal output circuit. If analog transistors of those circuit components of the signal output circuit are formed in the monocrystalline silicon layer in the SOI substrate, the output signal tends to be distorted by the "kink" effect. FIG. 5 shows a circuit diagram of a source follower circuit which is a typical example of the buffer 305. Since the gate voltage of an NMOS transistor 305b is fixed, the constant source-drain current flows through the NMOS transistor 305b. The current flowing through an NMOS transistor 305a is also constant, since it is determined by the transistor 305a. Therefore, the gate-source voltage in the NMOS transistor 305a is kept constant, and the output signal emerging from the junction between the transistors 305a and 305b is proportional to the input signal applied to the base of the transistor 305a. However, if the "kinking" occurs in the current-voltage curve of the NMOS transistor 305b, the source-drain current of the transistor 305b will change, accompanied by change of the gate-source voltage of the transistor 305a. This in turn results in distortion of the output signal. A similar phenomenon will occur in analog transistors of any of the amplifier 303 and the integrator 304, and the cumulative effect is that the output signal will be further distorted.

To avoid these problems, in one embodiment of the present invention, of the various transistors employed in the signal output circuit, the transistors that determine the bias voltage to be applied to each of the detectors and the analog transistors through which infrared-light signals pass are not formed in the monocrystalline silicon layer 102, but are formed directly on the monocrystalline silicon substrate 100.

The remaining transistors which are free from the above discussed problems may be formed in either the monocrystalline silicon layer 102 to reduce the parasitic capacitance, or on the monocrystalline silicon substrate 100.

Figure 2A:
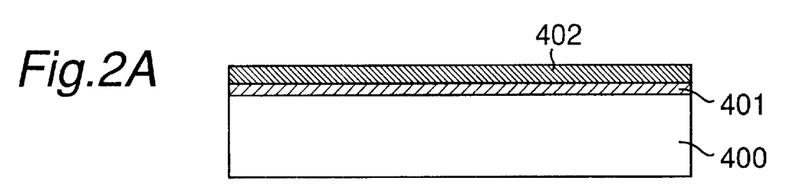
FIGS. 2A to 2G are schematic side sectional views showing the sequence of fabrication of the detector array according to the present invention.

FIG. 2A to FIG. 2G show the sequence of fabrication of the infrared-detector array of the present invention. As shown in FIG. 2A, an SOI substrate is used, wherein a monocrystalline silicon layer 402 overlies a silicon-oxide layer 401 that has been formed on a monocrystalline silicon substrate 400. For example, the "SIMOX" substrate or the "BESOI" substrate can be used for the substrate 400 in the practice of this fabrication method. In general, the thickness of the monocrystalline silicon layer 401 is about 1000 to 2000 Å, and the thickness of the silicon oxide layer 401 is about 1000 to 4000 Å. The thinner the thickness of the silicon oxide 401 is, the better the thermal insulating ability of the silicon oxide 401 is. However, the silicon oxide 401, if it is too thin, is apt to have pinholes. Therefore, the thickness of the silicon oxide 401 is preferably about 1000 Å.

Figure 2B:
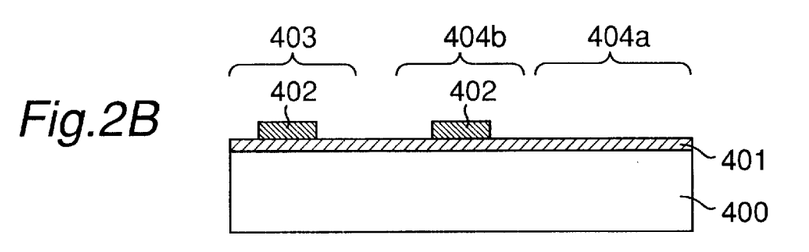

Then, as shown in FIG. 2B, the monocrystalline silicon layer 402 is partly removed by etching in a region 404a where transistors forming parts of the signal-output circuit are directly formed on the monocrystalline silicon substrate. At the same time, the monocrystalline silicon layer 402 is etched to form islands in region 404b and 403 thereof. The region 404b is the area where transistors of the signal-output circuit are to be formed in the monocrystalline silicon layer 402. The region 403 is the area where semiconductor-junction elements are to be formed. This etching process makes it possible to eliminate a LOCOS process, which is also referred as a selective oxidation process, for separation of transistors in the monocrystalline silicon layer 402. However, the LOCOS process may be used instead of the etching process to form the islands necessary to separate the transistors from each other.

Figure 2C:
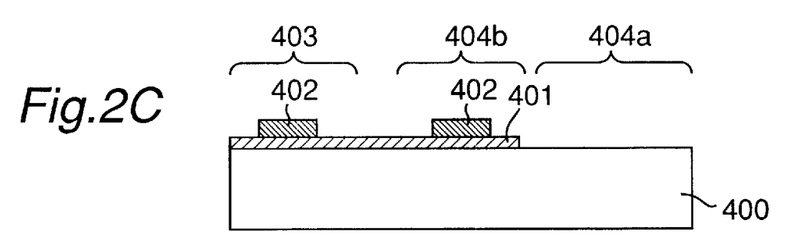
Figure 2D:
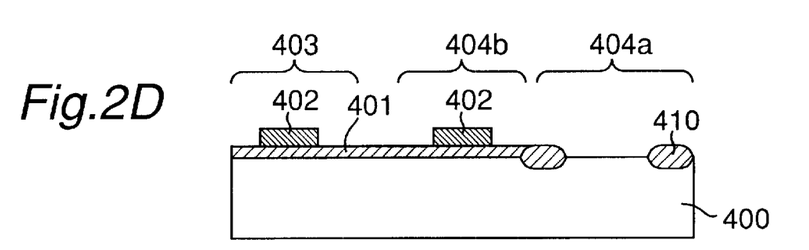

Next, as shown in FIG. 2C, the silicon-oxide layer 401 in the region 404a is removed by etching to form transistors directly on the monocrystalline silicon substrate 400. A field-oxide layer 410 is formed in the region 404 to separate the transistors formed on the silicon substrate 400 as shown in FIG. 2D. The field-oxide layer 410 may be formed by the use of the LOCOS process.

Figure 2E:
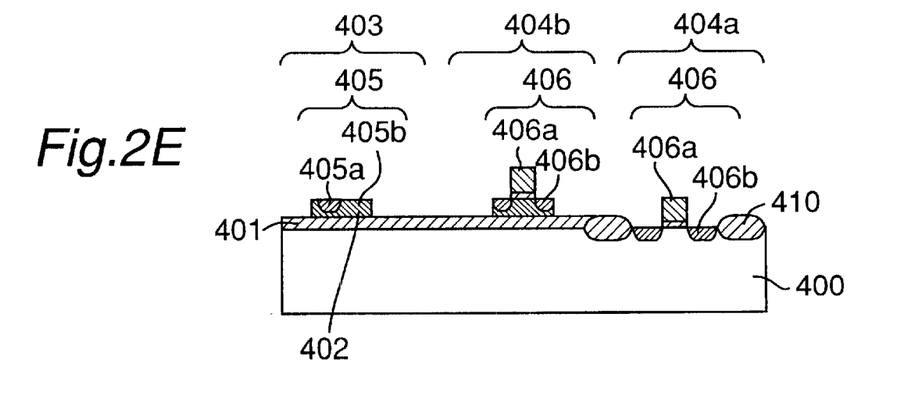

As shown in FIG. 2E, semiconductor junction elements, that is, p-n junction diodes 405 are then formed in the region 403 and, at the same time, transistors 406 forming parts of the signal-output circuit are formed in the region 404a and 404b, by means of any known method, for example, the standard MOS transistor circuit fabrication process. After gate electrodes 406a of the respective transistors 406 have been formed, an appropriate impurity is doped to make p type (or n type) electrodes 405a in the diodes 405 and source or drain electrode 406b in the transistors 406. In the case where the dopant impurity for the diodes 405 should be different from that for the transistors 406, they may be formed in different processes.

Figure 2F:
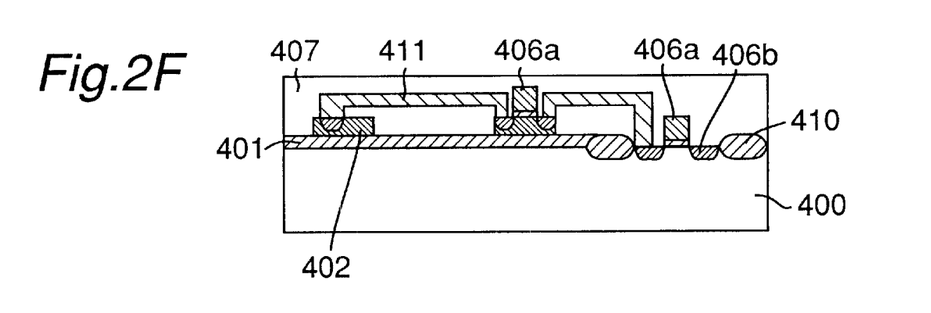

Thereafter, as shown in FIG. 2F, electrodes 405a and 405b of the diodes 405 forming the detectors, gates 406 and the source or drain electrodes 406b of the transistors 406 forming the signal output circuit are electrically connected in a required circuit pattern by means of leads 411, followed by deposition of an overcoat 407 to protect the detectors and circuit elements. The leads 411 and the overcoat 407 may be formed using standard materials generally employed in the practice of the semiconductor-fabrication process.

Figure 2G:
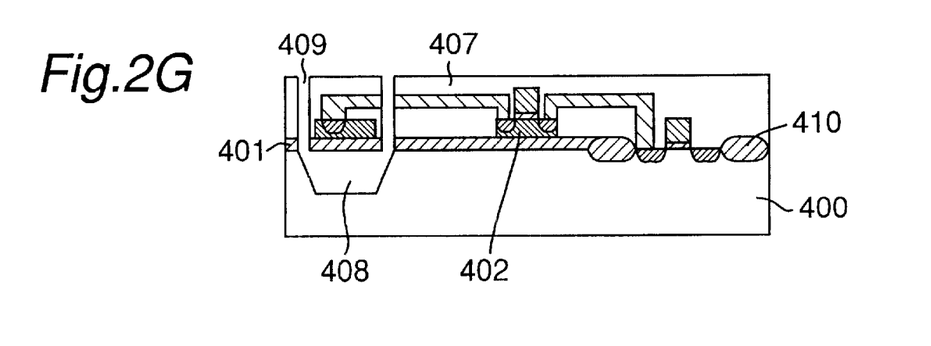

Finally, as shown in FIG. 2G, cavities 408 are formed under the respective diodes 405. The cavities 408 may be formed by the use of any known etching process, using gas or liquid as an etching reagent. The etching reagent flows into the cavities 408 through etching holes 409 formed in the overcoat 407 and the silicon oxide 401, and etches off a part of the silicon substrate 400. The etching may be either anisotropic or isotropic. For the anisotropic etching, a solution of potassium hydroxide, a solution of hydrazine, an aqueous solution of ethylenediamine-pyrocatechol (EPW solution) or a solution of tetramethylammonium (TMAH) may be used. The Potassium hydroxide solution or the TMAH solution is preferable because they have no toxicity. For the isotropic etching, a hydrogen fluoride solution may be used as etching liquid, and a mixture of carbon tetrafluoride and oxygen, a mixture of sulfur hexafluoride and oxygen, or xenon difluoride may be used as etching gas.

The fabrication method shown in FIGS. 2A to 2G has an advantage in that the semiconductor-junction elements 405 in the silicon layer 402 and the transistors of the signal-output circuit on the silicon substrate 400 can be formed simultaneously, thereby simplifying the fabrication method. A similar fabrication method can be applied to the infrared-detector array wherein the semiconductor-junction element 405 is a Schottky diode, a bipolar transistor, a junction field-effect transistor or a MOS transistor.

Figure 3A:
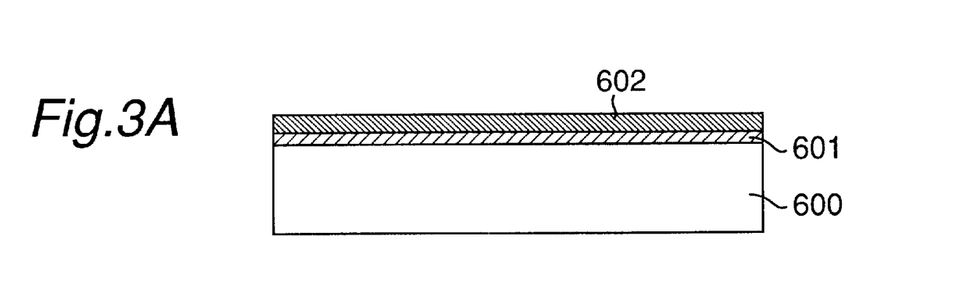
FIGS. 3A to 3D are schematic side sectional views, showing modified forms of the steps shown respectively in FIGS. 2A to 2D.

FIGS. 3A to 3D show process steps alternative to the process steps shown in FIGS. 2A to 2D. According to the fabrication method shown in FIGS. 3A to 3D, a SOI substrate are used wherein a monocrystalline silicon layer 602 overlies a silicon-oxide layer 601 on a monocrystalline-silicon substrate 600 as shown in FIG. 3A.

Figure 3B:
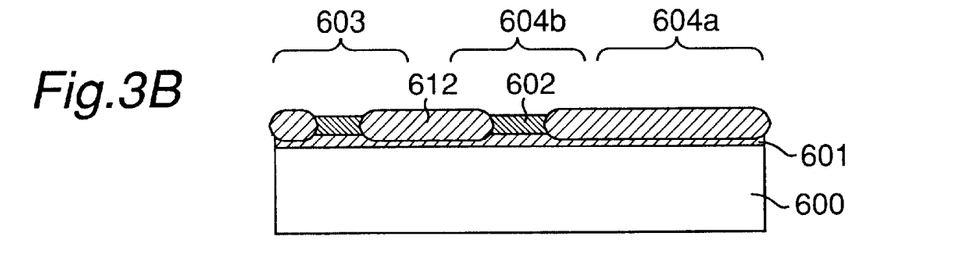

Then, as shown in FIG. 3B, the monocrystalline silicon layer 602 in the region 604a is oxidized by the LOCOS method. At the same time, the monocrystalline silicon layer 602 in the region 604b and 603 is oxidized partly, leaving appropriate spaces. The region 604a is the area where some of the transistors of the signal-output circuit are directly formed on the monocrystalline silicon substrate 600. The region 604b is the area where another part of transistors in the signal-output circuit are formed in the monocrystalline silicon layer 602. The region 603 is the area where the semiconductor-junction elements are formed. A field oxide layer 612 is formed at the oxidized sites.

Figure 3C:
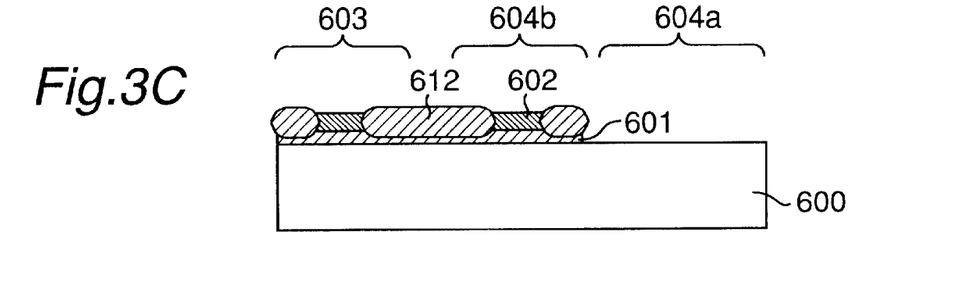
Figure 3D:
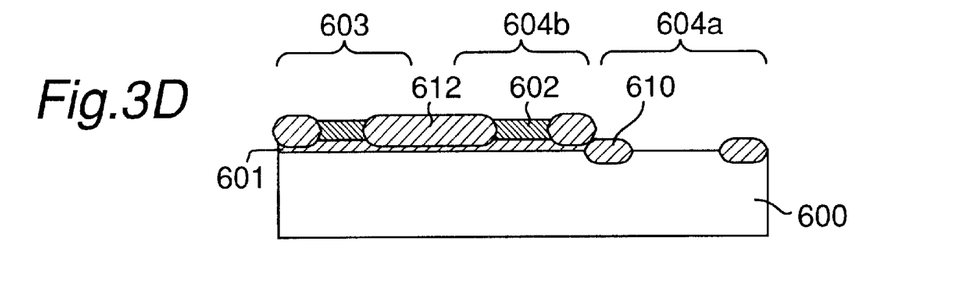

Next, as shown in FIG. 3C, the field-oxide layer 612 in the region 604a is removed by etching to form transistors directly on the monocrystalline silicon substrate 600. A field-oxide layer 610 is formed in the region 604a to separate the transistors formed on the silicon substrate 600 from each other as shown in FIG. 3D. The field oxide layer 610 may be formed by the use of the known LOCOS process.

Thereafter, the fabrication continues to the steps shown in FIGS. 2E to 2G to thereby complete the infrared-detector array.

The fabrication method shown in FIGS. 3A to 3D has an advantage in that a step at the end of the monocrystalline silicon layer 602 can be minimized so that problems in fabrication process such as etching residue and lead disconnection can advantageously be suppressed.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. An infrared-detector array comprising:
   a monocrystalline silicon substrate,
   a silicon oxide layer on said substrate,
   a monocrystalline silicon layer on the silicon oxide layer,
   a plurality of thermal infrared detectors arranged in a pattern in said monocrystalline silicon layer, and
   a signal-output circuit reading out respective signals from said infrared detectors, wherein each of said infrared detectors includes a semiconductor-junction element located in said monocrystalline silicon layer overlying said silicon oxide layer on said monocrystalline silicon substrate, and said signal-output circuit includes transistors, some of said transistors being located on said monocrystalline silicon substrate.

2. The infrared-detector array according to claim 1, wherein said monocrystalline silicon substrate includes cavities beneath said semiconductor-junction elements, and said semiconductor-junction elements are supported by said silicon oxide layer.

3. The infrared-detector array according to claim 1, wherein said semiconductor-junction element is a diode.

4. The infrared-detector array according to claim 1, wherein said semiconductor-junction element is selected from the group consisting of bipolar transistors, junction field-effect transistors, and MOS transistors.

5. A process of producing an infrared-detector array, said infrared-detector array comprising a plurality of semiconductor-junction elements forming respective infrared detectors and a signal-output circuit reading out respective signals from said semiconductor-junction elements, said process comprising:
   preparing a monocrystalline silicon layer on a silicon oxide layer on a monocrystalline silicon substrate;
   removing said monocrystalline silicon layer in a transistor region where transistors of said signal-output circuit are to be formed directly on said monocrystalline silicon substrate,
   removing said silicon oxide layer in the transistor region; and
   forming said semiconductor-junctions elements in said monocrystalline silicon layer and at least some of said transistors of said signal-output circuit directly on said monocrystalline silicon substrate.

6. The process according to claim 5, wherein, in removing said monocrystalline silicon layer, etching said monocrystalline silicon layer to form islands in regions where said semiconductor-junction elements are located in said monocrystalline silicon layer.

7. A process for producing an infrared-detector array, said infrared-detector array comprising a plurality of semiconductor-junction elements forming respective infrared detectors, and a signal-output circuit reading out signals from said semiconductor-junction elements, said process comprising:
   preparing a monocrystalline silicon layer on a silicon-oxide layer on a monocrystalline silicon substrate;
   oxidizing by an LOCOS method said monocrystalline silicon layer over a transistor region where at least some of transistors of said signal-output circuit are to be formed directly on said monocrystalline silicon substrate, and, partly, leaving appropriate spaces, in an element region where said semiconductor-junction elements are to be formed in said monocrystalline silicon layer;
   removing the oxidized monocrystalline silicon layer and said silicon-oxide layer in the transistor region; and
   forming said semiconductor-junction elements in said monocrystalline silicon layer, and at least some of said transistors of said signal-output circuit directly on said monocrystalline silicon substrate.

8. The infrared-detector array according to claim 1 wherein, of said transistors of said signal output circuit, transistors that determine bias voltage applied to each of said thermal infrared detectors are located directly on said monocrystalline substrate.

9. The infrared-detector array according to claims 1, wherein, of said transistors of said signal output circuit, at least analog transistors through which infrared-light signals generated by said thermal infrared detectors pass are located on said monocrystalline silicon substrate.

* * * * *